United States Patent
Kaehs et al.

(10) Patent No.: US 9,276,528 B2
(45) Date of Patent: Mar. 1, 2016

(54) TRANSMITTER SYSTEM WITH RECONFIGURABLE AMPLIFIERS

(71) Applicant: Rohde & Schwarz GmbH & Co. KG, Munich (DE)

(72) Inventors: Bernhard Kaehs, Unterhaching (DE); Sebastian Stempfl, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 14/422,625

(22) PCT Filed: Oct. 17, 2013

(86) PCT No.: PCT/EP2013/071695
§ 371 (c)(1),
(2) Date: Feb. 19, 2015

(87) PCT Pub. No.: WO2014/063984
PCT Pub. Date: May 1, 2014

(65) Prior Publication Data
US 2015/0229282 A1 Aug. 13, 2015

(30) Foreign Application Priority Data
Oct. 24, 2012 (DE) .......................... 10 2012 219 430

(51) Int. Cl.
| H04K 1/02 | (2006.01) |
| H03F 1/42 | (2006.01) |
| H03F 1/02 | (2006.01) |
| H03F 3/24 | (2006.01) |
| H03F 3/60 | (2006.01) |
| H03F 3/19 | (2006.01) |
| H03F 3/68 | (2006.01) |
| H04B 1/02 | (2006.01) |
| H04B 1/04 | (2006.01) |

(52) U.S. Cl.
CPC ............... *H03F 1/42* (2013.01); *H03F 1/0288* (2013.01); *H03F 3/19* (2013.01); *H03F 3/24* (2013.01); *H03F 3/602* (2013.01); *H03F 3/68* (2013.01); *H04B 1/02* (2013.01); *H03F 2200/111* (2013.01); *H03F 2200/36* (2013.01); *H03F 2200/451* (2013.01); *H03F 2203/7209* (2013.01); *H04B 2001/0408* (2013.01)

(58) Field of Classification Search
CPC ........................................................ H04L 27/02
USPC .......................................................... 375/297
See application file for complete search history.

(56) References Cited

U.S. PATENT DOCUMENTS

| 5,136,300 | A | * | 8/1992 | Clarke et al. ................... 342/175 |
| 6,069,525 | A | * | 5/2000 | Sevic et al. ...................... 330/51 |

(Continued)

FOREIGN PATENT DOCUMENTS

| DE | 102010034067 A1 | 2/2012 |
| EP | 1609239 B1 | 3/2004 |

(Continued)

OTHER PUBLICATIONS

Preliminary Report on Patentability for PCT Application No. PCT/EP2013/071695, mailed May 19, 2015 (7 pages).

*Primary Examiner* — Lihong Yu
(74) *Attorney, Agent, or Firm* — Lee & Hayes, PLLC

(57) ABSTRACT

An amplifier includes a coupler, a main amplifier, and an auxiliary amplifier. The main amplifier and the auxiliary amplifier are supplied with signals derived from at least one input signal and amplify these. The coupler combines output signals of the main amplifier and of the auxiliary amplifier. The main amplifier and/or the auxiliary amplifier comprises an operating point adjustable during operation.

17 Claims, 4 Drawing Sheets

(56) References Cited

U.S. PATENT DOCUMENTS

| | | | |
|---|---|---|---|
| 8,154,339 B2 * | 4/2012 | Zolghadri et al. | 330/124 R |
| 2006/0001485 A1 | 1/2006 | Parker et al. | |
| 2009/0021300 A1 * | 1/2009 | Romano | 330/2 |

FOREIGN PATENT DOCUMENTS

| | | |
|---|---|---|
| EP | 2159912 A1 | 3/2010 |
| JP | 2008017072 A | 1/2008 |
| WO | WO2010022613 A1 | 3/2010 |
| WO | WO2011127868 A2 | 10/2011 |

* cited by examiner

TRANSMITTER SYSTEM WITH RECONFIGURABLE AMPLIFIERS

This application claims priority to and is a national phase application of International Application No. PCT/EP2013/071695 filed on Oct. 17, 2013, entitled "A transmitter system with reconfigurable amplifiers," which claims priority to and the benefit of German Patent Application No. DE 10 2010 034 067 A1 filed on Oct. 24, 2012, entitled "A transmitter system with reconfigurable amplifiers," both of which are hereby incorporated by reference in their entirety.

TECHNICAL FIELD

The invention relates to an amplifier, an amplifier arrangement, a transmitter and a transmitter system.

BACKGROUND

Conventionally, high-frequency power amplifiers are often operated in the AB-mode, that is to say, a base bias voltage is generated by means of a bias configuration, for example, in the form of series-connected diodes, which even at low levels drive the transistors used to full output. In the AB mode, small signals, such as in the A mode, and large signals, such as in the B mode, are amplified. Such amplifiers operate with good efficiency with a particularly low-distortion, but only if they are operated with full level control close to compression. In the case of modern digital signals with strongly fluctuating envelope, this is only the case with the very rarely occurring signal peaks.

Since the mean level control with these signals is low, a relatively low average efficiency is obtained. With suitable dimensioning, AB amplifiers with a very broad bandwidth can be realized.

Furthermore, to improve the efficiency of such signals, Doherty amplifiers are known. In mobile-radio technology, especially in the case of modulation methods with non-constant envelope and high crest factor (for example COFDM signals), high-frequency amplifiers according to the Doherty principle have become increasingly widespread over recent years. For example, the German Patent Application DE 10 2010 034 067 A1 discloses such a Doherty amplifier. However, the disadvantage with such amplifiers is that they provide only a very narrow bandwidth.

In conventional transmitter systems, several Doherty amplifiers are used. Since these are embodied in each case with a narrow bandwidth, such transmitter systems provide a redundant transmitter, which can take over the function of a failed transmitter. However, so that the redundant transmitter can take over the function of every Doherty transmitter independently of its frequency range, this redundant transmitter is conventionally designed with a broad bandwidth. Accordingly, in an exemplary transmitter system with three different Doherty frequencies, transmitters with at least four different amplifier arrangements are installed. This incurs a high cost for keeping corresponding replacements in reserve.

SUMMARY

The invention is based upon the object of providing an amplifier, an amplifier arrangement, a transmitter and a transmitter system, with which a high efficiency can be achieved and which can be used over a broad frequency range. Furthermore, a simple, cost favorable maintenance should be made possible.

The object is achieved according to the invention for the amplifier, for the amplifier arrangement, for the transmitter, and for the transmitter system by the features described herein. Advantageous further developments form the subject matter of the dependent claims.

In the case of a conventional Doherty amplifier, a main amplifier and an auxiliary amplifier are connected at the output end by means of a coupler. In this context, the first output of the coupler is terminated with a capacitor, an inductance or an LC element. The second output of the coupler here is the power output. The configuration of the first output in this context determines the frequency range of the Doherty amplifier. By contrast, in the case of a conventional AB amplifier, the first output of the coupler is terminated with a load-balancing resistor, for example, of 50Ω. This load-balancing resistor acts in a stabilizing manner. If the second output of the coupler, the actual power output of the amplifier, is incorrectly matched, the reflected power flows back via the coupler to the main amplifier and auxiliary amplifier. These then operate in an asymmetrical manner as a result of the phase difference of the signal reflected from the coupler. The difference signal of the two amplifiers is absorbed in the load-balancing resistor, a mutual influence between the main amplifier and auxiliary amplifier does not occur. Accordingly, any damage to the amplifier can be avoided.

With the amplifier according to the invention, the aim is now to be able to change from a Doherty mode into a broadband mode during operation without physical switching. Accordingly, during operation, nothing can be changed in the configuration of the first output of the coupler. By preference, in the operational case, nothing can be switched over at the termination. However, the termination of the amplifier in the AB mode via a load-balancing resistor is necessary only if the output is not optimally matched. But if the power output is optimally matched, the configuration of the termination of the coupler plays no role whatsoever. The AB mode is a manner of operation in which the amplifier operates in the largely linear characteristic range but with a high power loss.

By preference, a Doherty configuration of the first output of the coupler is therefore used according to the invention. This occurs independently of the Doherty mode or broadband mode.

In this context, the main amplifier and/or the auxiliary amplifier provide an operating point adjustable during operation. Accordingly, they can each be used for the AB mode or the C mode. If both amplifiers are adjusted for the AB mode, the amplifier is disposed in the broadband mode. However, if one of the amplifiers, preferably the main amplifier, is adjusted for the C mode, the amplifier is disposed in the Doherty mode. In the Doherty mode, the amplifier provides a narrow bandwidth, but a very high efficiency. In the broadband mode, the amplifier provides a very broad bandwidth but a relatively lower efficiency. The C mode is a manner of operation in which the amplifier operates within the no longer linear characteristic range but with low power loss.

An amplifier arrangement according to the invention preferably contains a first amplifier as described above and a second amplifier as described above and a control device for the independent adjustment of the operating points of the main amplifier and/or auxiliary amplifier of the respective amplifiers. In this context, the amplifiers are to be operated independently of one another in each case in the Doherty mode or in the broadband mode. Accordingly, if one of the amplifiers of the amplifier arrangement fails, it can be replaced by an amplifier with arbitrary Doherty frequency range. If the frequency range agrees with the frequency range of the amplifier arrangement, the newly introduced amplifier operates in the Doherty mode. If the frequency does not agree, it operates in the broadband mode.

In this context, the control device preferably detects the frequency range of every amplifier of the amplifier arrangement or reads it out of the memory which is preferably a part of the respective amplifier. This therefore ensures that every amplifier is operated in the Doherty mode only when the frequency ranges agree.

Alternatively, the control device is preferably embodied to communicate a required frequency range of the amplifier arrangement to all amplifiers. The amplifiers are then embodied to operate in the Doherty mode when the required frequency range corresponds to their frequency range and to operate in the broadband mode when this is not the case.

Furthermore, the amplifier arrangement preferably comprises a reflection detector and an attenuation element. In this context, the reflection detector is embodied to detect reflections at an output of the amplifier arrangement. In a preferred manner, it therefore provides a directional coupler, which reroutes only signals reflected at the signal output. The attenuation element is then embodied to adjust an attenuation factor dependent upon reflections detected by the reflection detector. This ensures that no components of the amplifier arrangement are damaged by excessively strong reflections. This is achieved by increasing the attenuation factor when high reflections are detected.

By particular preference, the amplifier arrangement further comprises a phase-adjustment element which is embodied to compensate phase hops in the event of an adjustment of the operating point of the main amplifier and/or of the auxiliary amplifier of at least one of the amplifiers. In this manner, undesired phase hops in the event of a change of the operating points can be avoided.

A transmitter according to the invention preferably contains at least one first and one second amplifier arrangement as described above. In this context, the transmitter provides a desired frequency range. All of the amplifiers of the amplifier arrangements of the transmitter operate in the Doherty mode within the desired frequency range of the transmitter or in the broadband mode.

Accordingly, the individual amplifiers of the amplifier arrangements preferably operate in the Doherty mode when their frequency ranges correspond to the desired frequency range of the transmitter. If they do not correspond to the desired frequency range, or the signaling of the desired frequency range is not successful for arbitrary reasons, they preferably operate in the broadband mode. In this context, they preferably receive the desired frequency range from a transmitter control or obtain it communicated from the control device of the respective amplifier arrangement.

A transmitter system according to the invention preferably contains a first and second transmitter as described above and furthermore a redundant transmitter. In this context, the redundant transmitter preferably contains a first amplifier arrangement and a second amplifier arrangement, as already described. Accordingly, the redundant transmitter is out of operation so long as all of the other transmitters of the transmitter system are in operation and/or provide a given minimum power. The redundant transmitter is in operation as soon as a transmitter of the transmitter system is out of operation. This means that the transmitter system can still operate if one of the transmitters fails or does not provide the given minimum power.

In this context, the individual amplifiers of the amplifier arrangements of the transmitters preferably operate in the Doherty mode when their frequency ranges correspond to the desired frequency range of the transmitter. If they do not correspond to the desired frequency range or the signaling of the desired frequency range is not successful for arbitrary reasons, they preferably operate in the broadband mode. Accordingly, they preferably receive the desired frequency range from a transmitter control or have it communicated from the control device of the respective amplifier arrangement.

Alternatively, in this context, all of the amplifiers of an amplifier arrangement operate in the same mode. They all operate in the Doherty mode if all of their frequency ranges correspond to the desired frequency range. They all operate in the broadband mode as soon as a frequency range does not correspond to the desired frequency range or the signaling of the frequency range to one of the amplifiers does not function.

By particular preference, the amplifiers of the amplifier arrangements of the redundant transmitter operate in the Doherty mode when the frequency ranges of the amplifiers correspond to the frequency range of the transmitter of the transmitter system disposed out of operation. The amplifiers of the amplifier arrangements of the redundant transmitter then operate in the broadband mode when the frequency ranges of the amplifiers do not correspond to the frequency range of the transmitter disposed out of operation.

By preference, the amplifiers of the amplifier arrangements of the redundant transmitter always operate in the broadband mode. A tuning of the remaining configuration of the redundant transmitter for a Doherty mode is then not necessary. Since the redundant transmitter only operates anyway in the event of a failure of one of the other transmitters, a relatively lower efficiency of the redundant transmitter can be taken into account.

By preference, the redundant transmitter provides in each case at least one amplifier arrangement with a frequency range of each of the other amplifier arrangements of the transmitter system. In this case, the redundant transmitter can be used only in the broadband mode. However, it is advantageous here that the redundant transmitter can be used as a replacement-part store for the other transmitters. As soon as an amplifier arrangement of one of the other transmitters fails, an amplifier arrangement of corresponding frequency range can be removed from the redundant transmitter to replace the faulty amplifier arrangement of the actual transmitter.

By preference, the transmitter system provides a redundant amplifier arrangement of an arbitrary frequency range. In this context, the latter is not in operation but is held in reserve as a replacement part. The transmitter system is then embodied to allow a removal of the failed amplifier arrangement during operation in the event of a failure of an amplifier arrangement of a transmitter, to allow a removal of an amplifier arrangement of the corresponding frequency range from the redundant transmitter, to allow an introduction of the amplifier arrangement of the redundant transmitter instead of the failed amplifier arrangement and/or to allow a replacement of the amplifier arrangement of the redundant transmitter with the redundant amplifier arrangement.

Accordingly, only a single amplifier arrangement of an arbitrary Doherty frequency range is necessary as a replacement-part store for the transmitter system. This considerably reduces the cost for keeping replacement parts in reserve.

BRIEF DESCRIPTION OF THE DRAWINGS

In the following, the invention is described by way of example on the basis of the drawings in which advantageous exemplary embodiments of the invention are shown. The figures depict as follows.

DETAILED DESCRIPTION

Initially, the general construction and functioning of a Doherty amplifier, a broadband amplifier and, especially, an exemplary embodiment of the amplifier according to the invention will be explained with reference to FIG. 1. With reference to FIG. 2, the different frequency ranges of the various amplifiers are presented. The construction and functioning of an exemplary embodiment of an amplifier arrangement according to the invention is shown with reference to FIG. 3. The construction and functioning of an exemplary embodiment of the transmitter system according to the invention and the transmitter according to the invention are explained on the basis of FIG. 4-FIG. 5. In some cases, the presentation and description of identical elements in similar drawings has not been repeated.

Figure 1:
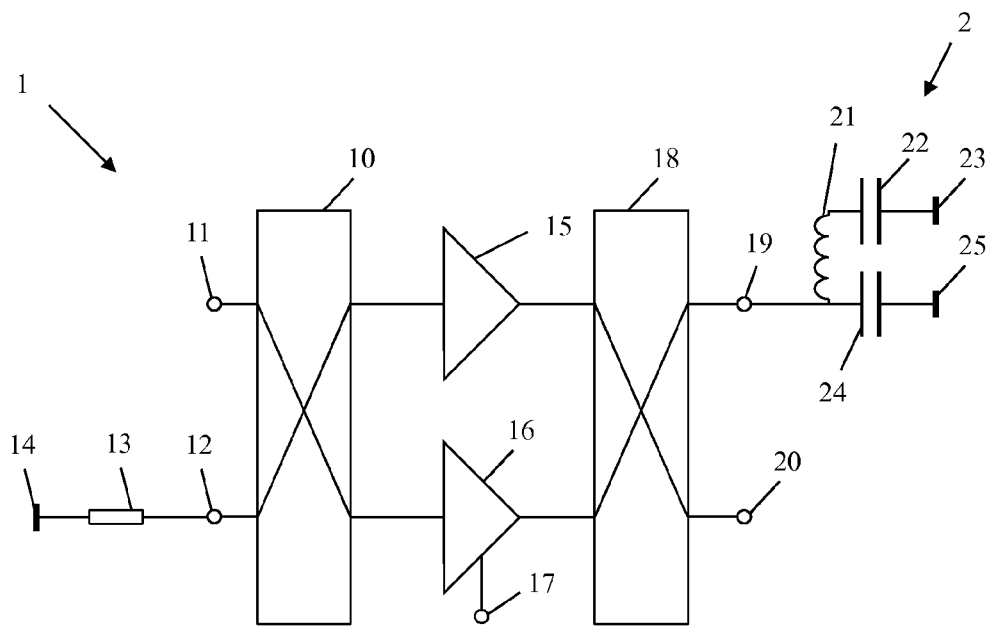
FIG. 1 illustrates an exemplary embodiment of the amplifier according to the invention in a block-circuit diagram.
Figure 2:
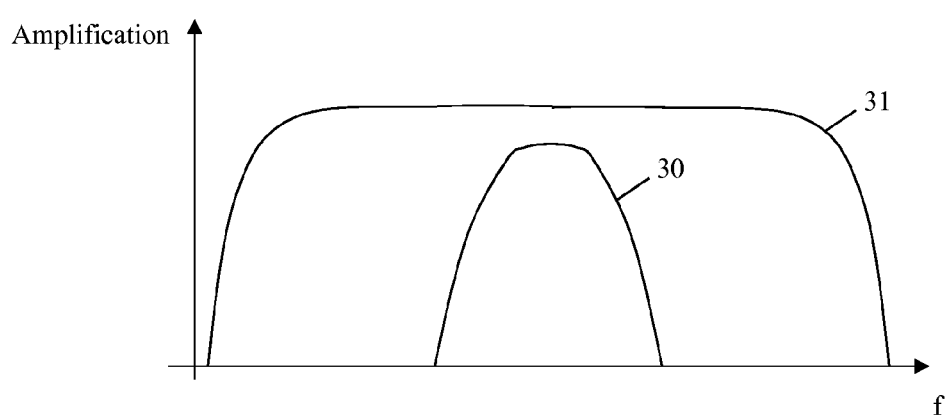
FIG. 2 illustrates frequency ranges of an exemplary embodiment of the amplifier according to the invention in the Doherty mode and in the broadband mode.

FIG. 1 shows an amplifier 1. This contains a signal input 11 which is connected to a first input of a first coupler 10. At a second input of the coupler 10, a load-balancing resistor 13 is connected and is connected at its remote end to a ground terminal 14. The coupler 10 is connected at its output to a main amplifier 15 and an auxiliary amplifier 16. In this context, the auxiliary amplifier 16 comprises an operating-point adjustment terminal 17, by means of which the operating point of the auxiliary amplifier 16 can be adjusted. Optionally, the main amplifier 15 can also comprise such a terminal. The outputs of the main amplifier 15 and of the auxiliary amplifier 16 are connected in this context to a second coupler 18.

Accordingly, a first output 19 of the second coupler 18 is connected to a termination 2. The termination 2 here provides a parallel capacitor 24 connected to a ground terminal 25. Furthermore, the termination 2 provides an inductance 21, connected in series to a capacitor 22 at a ground terminal 23. In this context, however, the termination 2 is not fixed to this precise configuration. A configuration with only a single inductance or capacitor or an LC element or a filter structure comprising inductances and/or capacitors is also possible. By means of the components of the termination 2 here, the frequency range of the amplifier 1 is adjusted in the Doherty mode. Furthermore, the second coupler 18 comprises a second output 20 which is the power output of the amplifier 1.

If the main amplifier 15 is operated in the AB mode, and the auxiliary amplifier 16 in the C mode, the amplifier 1 operates in the Doherty mode. The frequency range is then adjusted by the termination 2. However, if the operating point of the auxiliary amplifier 16 is varied by means of the operating-point adjustment terminal 17 in such a manner that the auxiliary amplifier 16 also operates in the AB mode, the amplifier 1 then operates in the broadband mode. If the output 20 is optimally tuned, no reflections occur at the output 19. That is, the signals arriving at the output 19 are completely cancelled. The configuration of the output 19 and therefore the termination 2 are therefore irrelevant. Accordingly, it is possible to change from a Doherty mode to a broadband mode and back again without physical switching of the termination 2, only by varying the operating point of the auxiliary amplifier 16. The roles of the main amplifier 15 and of the auxiliary amplifier 16 are also exchangeable in this context. Similarly, if the main amplifier 15 provides an operating-point adjustment terminal, the latter can also, of course, be operated in the C mode as an alternative.

However, the operation of the amplifier 1 described above is problematic if the output terminal 20 is not tuned optimally. In this case, reflections occur, which are supplied to the auxiliary amplifier 16 and to the main amplifier 15 via the coupler 18 with phase-position offset by 90°. The auxiliary amplifier 16 and the main amplifier 15 then operate with different load impedances. The difference signal of the auxiliary amplifier 16 and main amplifier 15 is then disposed at the output 19 of the coupler 18. Since no load-balancing resistor which absorbs the difference signal is connected to the output 19, this signal is also reflected to the auxiliary amplifier 16 and main amplifier 15. A mutual influence of auxiliary amplifier 16 and main amplifier 15 then occurs, which, in the worst case, can lead to instability and damage to components. Measures for avoiding such damage will be described with reference to FIG. 3.

FIG. 2 shows a frequency range 30 of an amplifier 1 in the Doherty mode. A frequency range 31 of the amplifier 1 in the broadband mode is also shown. It is clearly evident that the amplifier 1 provides a significantly wider frequency range 31 in the broadband mode than in the Doherty mode. Only a frequency range 30 of the amplifier 1 in the Doherty mode is shown here. By varying the termination 2, the frequency range 30 can be displaced in the direction towards higher or lower frequencies. However, a change of the bandwidth is possible only within very narrow limits.

Figure 3:
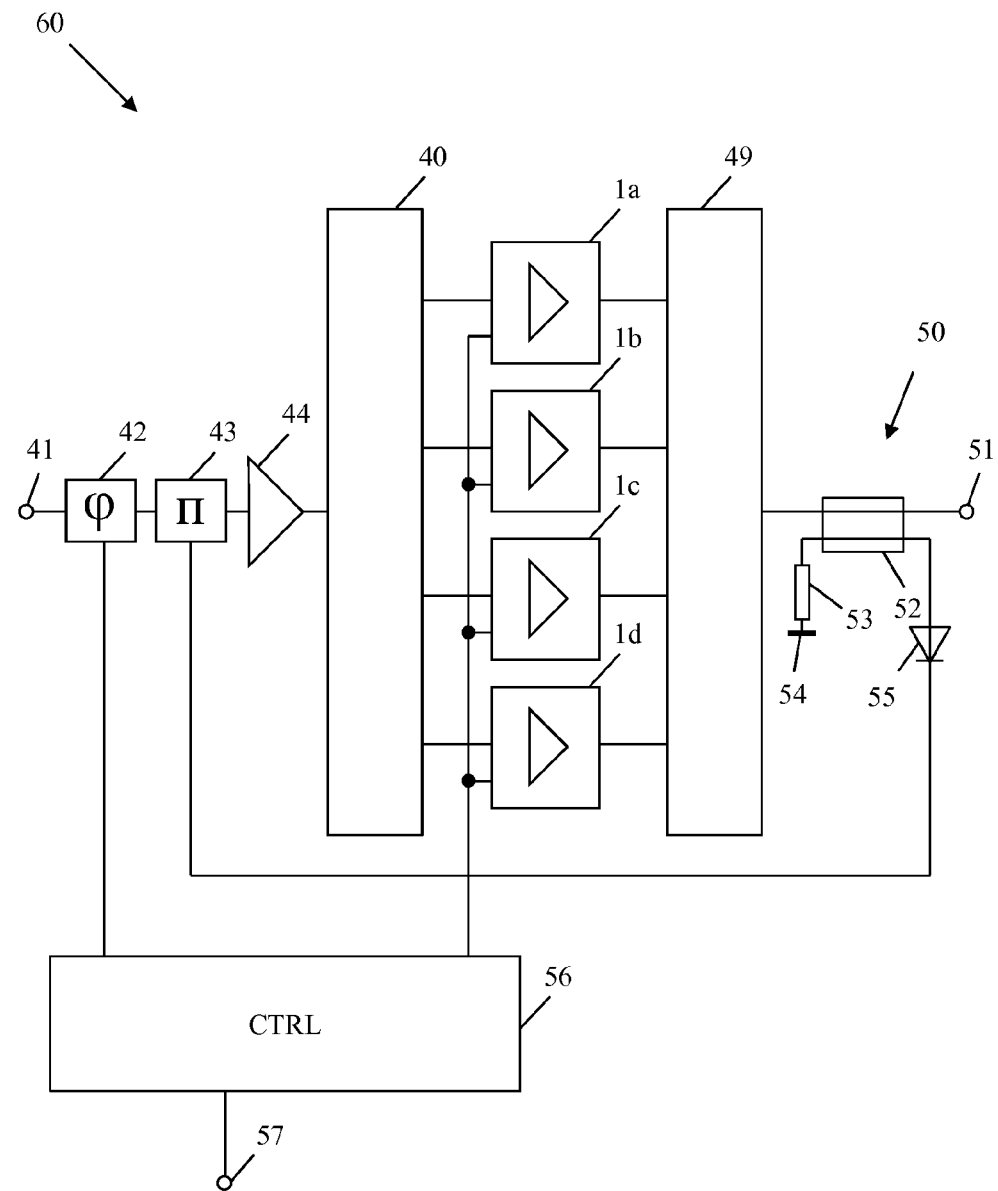
FIG. 3 illustrates an exemplary embodiment of the amplifier arrangement according to the invention.

FIG. 3 shows an exemplary embodiment of the amplifier arrangement 60 according to the invention. The amplifier arrangement 60 contains a signal input 41 which is connected to a phase adjustment element 42. The latter is connected to an attenuation element 43 which is connected in turn to a pre-amplifier 44. The pre-amplifier 44 is connected in turn to a signal splitter 40. The signal splitter 40 is connected to a plurality of amplifiers 1a-1d which correspond to the amplifier 1 from FIG. 1. The outputs of the amplifiers 1a-1d are each connected to a signal combiner 49. In this context, each of the amplifiers 1a-1d additionally comprises an operating-point adjustment terminal by means of which the amplifiers 1a-1d are connected to a control device 56. The control device 56 is further connected to a phase-adjustment element 42 and a control input 57. The signal combiner 49 in this context is connected via a reflection detector 50 to a signal output 51.

The reflection detector 50 preferably contains a directional coupler 52 which is connected at its one terminal via an ohmic resistor 53 to a ground terminal 54. At a second terminal, the directional coupler 52 is connected via a diode 55 to the attenuation element 43.

A signal to be amplified is supplied at the signal input 41. A phase position of the supplied signal is adjusted via the phase-adjustment element. This adjustment is implemented controlled by the control device 56. The resulting signal is supplied to the attenuation element 43 and optimally attenuated by the latter. A resulting signal is supplied to the pre-amplifier 44 and pre-amplified by the latter with a fixed amplification factor. Alternatively, the attenuation element 43 can be dispensed with. In this case, the reflection detector is connected directly to the pre-amplifier 44 and adjusts the pre-amplification factor. The pre-amplified signal is distributed via the signal splitter 40 to the respective amplifiers 1a-1d. The amplifiers 1a-1d amplify the signal. It is combined by the signal combiner 49 and output at the signal output 51. In this context, the reflection detector 50 detects the reflections reflected back from the output terminal 51 by means of the diode 55. The output signal of the diode 55 thus serves directly for the adjustment of the attenuation factor of the attenuation element 43, respectively of the pre-amplification factor of the pre-amplifier 44 as an alternative if no attenuation element 43 is installed. In this manner, the amplitude of the signal supplied to the amplifiers 1a-1d is reduced if reflections are detected. This serves for the protection of the amplifiers 1a-1d.

In this context, the amplifiers 1a-1d operate in the Doherty mode provided their respective frequency range corresponds to a desired frequency range of the amplifier arrangement 60. This is monitored by the control device 56. Accordingly, two different procedures are possible. On the one hand, the control device 56 can read out what the frequency ranges of the individual amplifiers 1a-1d are. The control device 56 then adjusts the individual amplifiers 1a-1d in turn in order to operate in the Doherty mode or in the broadband mode. A Doherty mode is thus adjusted if the frequency ranges agree. A broadband mode is adjusted if the frequency ranges do not agree. Alternatively, the control device 56 merely communicates to the individual amplifiers 1a-1d the desired frequency range of the amplifier arrangement 60. The individual amplifiers 1a-1d are then adjusted automatically to operate in the Doherty mode if the desired frequency range of the amplifier arrangement 60 corresponds to their own frequency range, and set a broadband mode if this is not the case. As an additional safety mechanism, the amplifiers 1a-1d preferably operate in the broadband mode if an error occurs in the transmission of the desired frequency range of the amplifier arrangement 60. This can safely prevent an amplifier from being operated in the incorrect frequency range. Via the control input 57, the desired frequency range of the amplifier arrangement 60 is communicated to the control device 56.

Figure 4:
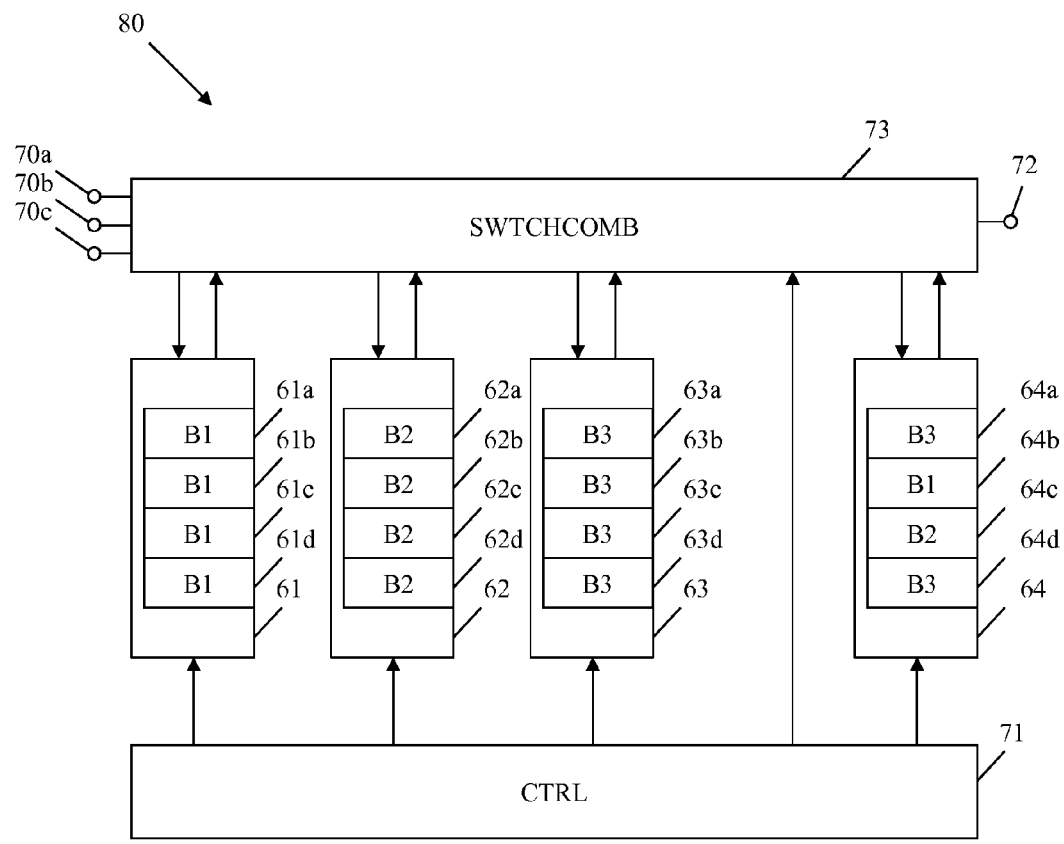
FIG. 4 illustrates an exemplary embodiment of the transmitter system according to the invention.
Figure 4:
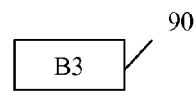

FIG. 4 shows an exemplary embodiment of the transmitter system 80 according to the invention. The latter provides a first transmitter 61, a second transmitter 62 and a third transmitter 63. Furthermore, it provides a redundant transmitter 64. The first transmitter 61 in this context provides amplifier arrangements 61a-61d. The latter each provide a first frequency range B1. The second transmitter 62 accordingly provides amplifier arrangements 62a-62d. The latter each have a second frequency range B2. In turn, the third transmitter 63 provides amplifier arrangements 63a-63d. The latter each have a frequency range B3. In this context, the redundant transmitter 64 provides amplifier arrangements 64a-64d. The amplifier arrangement 64a has a frequency range B3. The amplifier arrangement 64B accordingly provides a frequency range B1. In this context, the amplifier arrangement 64c provides the frequency range B2. Accordingly, the amplifier arrangement 64d has the frequency range B3.

Furthermore, the transmitter system 80 contains a control device 71, which is embodied to control the transmitters 61-64, to switch on the redundant transmitter 64 when required and to switch off the transmitters 61-63 when required. It also communicates to the redundant transmitter which transmitter 61-63 it should take over from.

Furthermore, the transmitter system contains a switching and combining device 73, which provides signal inputs 70a-70c. The signals of the different frequency ranges B1-B3 are supplied via these signal inputs 70a-70c. The switching and combining device 73 distributes the signals to the transmitters 61-64 and combines output signals of the transmitters 61-64.

An input signal is supplied to the switching and combining device 73 via the terminals 70a-70c and supplied from the latter to the transmitters 61-63 and to the redundant transmitter 64. Provided no fault is present, only the transmitters 61-63 operate. The redundant transmitter 64 is then deactivated. This is controlled by the control device 71. The transmitters 61-63 distribute the signal to the individual amplifier arrangements 61a-61d, 62a-62d and 63a-63d. The individual amplifier arrangements 61a, 61b, 61c, 61d, 62a, 62b, 62c, 62d, 63a, 63b, 63c, 63d amplify the signal in their respective frequency range and communicate it back to the switching and combining device 73, which combines and outputs the signal at the signal output 72. For the sake of clarity, the presentation of further elements of the transmitter respectively the transmitter system, such as, filters etc. has been omitted here.

If individual amplifier arrangements 61a, 61b, 61c, 61d, 62a, 62b, 62c, 62d, 63a, 63b, 63c, 63d of the transmitters 61-63 fail, the transmitters 61-63 continue to operate conventionally. A slight decline in the output power of the transmitter system is tolerable. However, if several amplifier arrangements 61a, 61b, 61c, 61d, 62a, 62b, 62c, 62d, 63a, 63b, 63c, 63d of an individual transmitter 61-63 fail, the output power in the corresponding frequency range B1-B3 is no longer sufficient. In this case, the respective transmitter 61-63 is deactivated, and the redundant transmitter 64 is activated instead. This control is implemented by the control device 71. Accordingly, the redundant transmitter 64 in the exemplary embodiment shown here always operates in the broadband mode. That is, the efficiency of the transmitter system 80 declines as a result of the use of the redundant transmitter 64.

In the arrangement presented here, the failure of, for example, a single amplifier arrangement of a transmitter 61-63 would be tolerated. As soon as a second amplifier arrangement of a transmitter 61-63 fails, the changeover to the redundant transmitter 64 is implemented. Alternatively, the changeover can also already be implemented in the event of a failure of the first amplifier arrangement.

In an alternative embodiment, the redundant transmitter 64 could contain only amplifier arrangements 64a-64d of a single frequency range B1, B2 or B3. In this case, the redundant transmitter 64 can be operated in the Doherty mode in its respective frequency range B1, B2 or B3, if it replaces a transmitter 61, 62 or 63 of corresponding frequency range. However, if it replaces a transmitter of different frequency range B1, B2 or B3, it then operates in the broadband mode.

However, if the embodiment of the redundant transmitter 64 illustrated in the FIG. 4 is used, the redundant transmitter 64 can serve at the same time as a replacement-part store for the other transmitters 61-63. If an amplifier arrangement 61a-63d of one of the transmitters 61-63 fails, an amplifier arrangement 64a-64d of the corresponding frequency range can be taken from the redundant transmitter 64 to replace the failed amplifier arrangement. However, in order to keep in reserve in all of the transmitters 61-63 and within the redundant transmitter 64 only functioning amplifier arrangements, an additional redundant amplifier arrangement 90 is necessary as a replacement part. In this case, the latter provides a frequency range B3. It serves as a replacement part if one of the amplifier arrangements 60, 61a, 61b, 61c, 61d, 62a, 62b, 62c, 62d, 63a, 63b, 63c, 63d fails. If the frequency range B3 does not correspond to the frequency range of the failed amplifier arrangement 60, 61a, 61b, 61c, 61d, 62a, 62b, 62c, 62d, 63a, 63b, 63c, 63d, a replacement with an arbitrary amplifier arrangement 64a, 64b, 64c, 64d of the redundant transmitter 64 can be implemented.

With a conventional transmitter system, however, amplifier arrangements of every frequency range and additionally broadband amplifier arrangements for the redundant transmitter are necessary as replacements. Accordingly, at least four amplifier arrangements are needed as replacements. With the transmitter system according to the invention, only a single redundant amplifier arrangement 90 is necessary as a replacement part.

Figure 5:
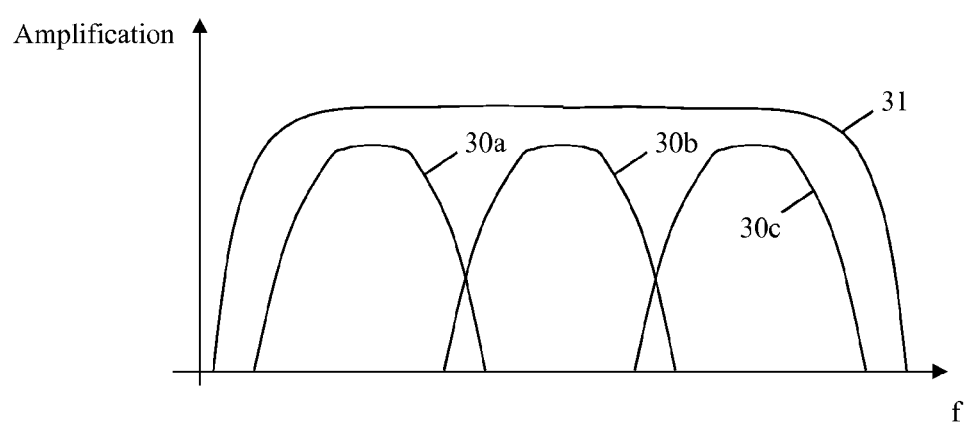
FIG. 5 illustrates frequency ranges of several amplifiers of an exemplary embodiment of the transmitter system according to the invention.

Finally, FIG. 5 provides an overview of possible frequency ranges 30a-30c of different amplifiers in the Doherty mode. At the same time, the frequency range 31 of an amplifier in the broadband mode is shown. It is clearly evident that the frequency ranges 30a-30c overlap at least partially. This ensures that a continuous frequency range is covered by the amplifiers in the Doherty mode.

In this context, the invention is not restricted to the exemplary embodiment presented. Of course, different numbers of amplifiers, respectively amplifier arrangements, respectively transmitters can also be used. Multiply nested Doherty amplifiers can also be used. All of the features described above or shown in the drawings can be arbitrarily combined with one another in an advantageous manner within the scope of the invention.

The invention claimed is:

1. An amplifier comprising:
    a coupler;
    a main amplifier; and
    an auxiliary amplifier,
    wherein the main amplifier and the auxiliary amplifier are supplied with signals derived from an input signal and amplify the input signal,
    wherein the coupler combines output signals of the main amplifier and of the auxiliary amplifier,
    wherein at least one of the main amplifier or the auxiliary amplifier includes an operating point that is adjustable during operation,
    wherein a first output of the coupler is terminated with a termination that is not in use and is physically non-switchable during operation, the termination having one or more components including at least one of an inductance, a capacitor, or an element that is a series connection of an inductance and a capacitance ("LC element"),
    wherein an output signal of the amplifier is detectable at a second output of the coupler, and
    wherein, through a dimensioning of the one or more components of the termination, a frequency range of the amplifier in a Doherty mode is adjustable.

2. The amplifier according to claim 1, wherein the operating point of the at least one of the main amplifier or the auxiliary amplifier is for an AB-mode or a C-mode, and
    wherein an adjustment of the operating point of the at least one of the main amplifier or the auxiliary amplifier allows a switching between a broadband mode and a Doherty mode of the amplifier.

3. The amplifier according to claim 1, wherein a frequency range of the amplifier in a broadband mode is independent of the dimensioning of the one or more components of the termination.

4. The amplifier according to claim 1, wherein a frequency range of the amplifier in a broadband mode is partially independent of the dimensioning of the one or more components of the termination.

5. An amplifier arrangement, comprising:
    a first amplifier, which is an amplifier according to claim 1;
    a second amplifier, which is an amplifier according to claim 1; and
    a control device for independent adjustment of the respective operating points of the at least one of the main amplifier and the auxiliary amplifier of the respective first and second amplifiers,
    wherein the first and second amplifiers are independently operable in the Doherty mode and in a broadband mode.

6. The amplifier arrangement according to claim 5, further comprising a memory,
    wherein the control device detects or reads out from the memory a frequency range of every amplifier of the amplifier arrangement in order to:
        adjust the operating point of each amplifier of which the frequency range corresponds to a desired frequency range of the amplifier arrangement to operate in the Doherty mode, and
        adjust the operating point of each amplifier of which the frequency range does not correspond to the desired frequency range of the amplifier arrangement to operate in the broadband mode.

7. The amplifier arrangement according to claim 5, wherein the control device communicates a desired frequency range of the amplifier arrangement to every amplifier of the amplifier arrangement amplifiers, and
    wherein the first and second amplifiers of the amplifier arrangement:
        operate in the Doherty mode when the desired frequency range corresponds to the frequency range of the respective first and second amplifiers, and
        operate in the broadband mode when the desired frequency range does not correspond to the frequency range of the respective first and second amplifiers.

8. The amplifier arrangement according to claim 5, further comprising:
    a reflection detector that detects reflections at an output of the amplifier arrangement; and
    an attenuation element that adjusts an attenuation factor dependent upon reflections detected by the reflection detector.

9. The amplifier arrangement according to claim 5, further comprising a phase adjustment element that compensates phase hops of the output signal of the respective first and second amplifiers in an adjustment of the respective operating points of the at least one of the main amplifier and of the auxiliary amplifier of at least one of the first and second amplifiers.

10. A transmitter, comprising:
    a first amplifier arrangement, which is an amplifier arrangement according to claim 5; and
    a second amplifier arrangement, which is an amplifier arrangement according to claim 5,
    wherein the transmitter has a desired frequency range, and
    wherein all amplifiers of the respective first and second amplifier arrangements of the transmitter are independently operable in the Doherty mode in the desired frequency range of the transmitter and in the broadband mode.

11. A transmitter system, comprising:
    a first transmitter, which is a transmitter according to claim 10;
    a second transmitter, which is a transmitter according to claim 10; and
    a redundant transmitter, which is a transmitter according to claim 10,
    wherein the redundant transmitter does not operate if the first and second transmitters of the transmitter system are in operation and achieve a given minimum output, and
    wherein the redundant transmitter operates as soon as one of the first and second transmitters of the transmitter system is out of operation or as soon as operation of the first and second transmitter falls below the given minimum output.

12. The transmitter system according to claim 11, wherein the respective amplifiers of the respective amplifier arrangements of the redundant transmitter operate in the Doherty mode when the frequency ranges of the respective amplifiers correspond to a frequency range of the one of the first and second transmitters which is disposed out of operation, and wherein the respective amplifiers of the respective amplifier arrangements of the redundant transmitter operate in the broadband mode when the frequency ranges of the respective amplifiers do not correspond to the frequency range of the transmitter disposed out of operation.

13. The transmitter system according to claim 11, wherein the respective amplifiers of the respective amplifier arrangements of the redundant transmitter always operate in the broadband mode.

14. The transmitter system according to claim 11, wherein the redundant transmitter includes at least one amplifier arrangement having every frequency range of all other amplifier arrangements of the transmitter system.

15. The transmitter system according to claim 14, wherein the transmitter system further comprises a redundant amplifier arrangement of arbitrary frequency range, wherein, in case of a failed amplifier arrangement during operation, the failed amplifier arrangement being one of the respective first and second arrangements of one of the first and second transmitters, the transmitter system accommodates:
  a removal of the failed amplifier arrangement,
  a removal of one of the first and second amplifier arrangements of the redundant transmitter having a frequency range that corresponds with a frequency range of the failed amplifier arrangement,
  an introduction of the one of the first and second amplifier arrangements of the redundant transmitter instead of the failed amplifier arrangement, and
  a replacement of the one of the first and second amplifier arrangements of the redundant transmitter with the redundant amplifier arrangement.

16. An amplifier arrangement, comprising:

a plurality of amplifiers, each amplifier including a coupler, a main amplifier, and an auxiliary amplifier, the respective main amplifiers and auxiliary amplifiers being supplied with signals derived from an input signal and amplifying the input signal, the respective couplers combining respective output signals of the respective main amplifiers and auxiliary amplifiers, and at least one of the respective main amplifiers or auxiliary amplifiers including an operating point adjustable during operation; and a control device for independent adjustment of the respective operating points of the respective main amplifiers and auxiliary amplifiers of the plurality of amplifiers, wherein the plurality of amplifiers are independently operable in a Doherty mode and in a broadband mode, wherein a first output of each respective coupler is terminated with a termination that is not in use and is physically non-switchable during operation, the respective terminations having one or more components including at least one of an inductance, a capacitor, or an element that is a series connection of an inductance and a capacitance ("LC element"), wherein an output signal of each amplifier is detectable at a second output of the respective couplers, and wherein, through a dimensioning of the one or more components of the respective terminations, a frequency range of the respective amplifiers in the Doherty mode is adjustable.

17. A transmitter, comprising:

a first amplifier arrangement and a second amplifier arrangement, each of the amplifier arrangements respectively including, a plurality of amplifiers, each amplifier including a coupler, a main amplifier, and an auxiliary amplifier, the respective main amplifiers and auxiliary amplifiers being supplied with signals derived from an input signal and amplifying the input signal, the respective couplers combining respective output signals of the respective main amplifiers and auxiliary amplifiers, and at least one of the respective main amplifiers or auxiliary amplifiers including an operating point adjustable during operation, and a control device for independent adjustment of the respective operating points of the respective main amplifiers and auxiliary amplifiers of the plurality of amplifiers, the plurality of amplifiers being independently operable in a Doherty mode and in a broadband mode, wherein the transmitter has a desired frequency range, wherein every amplifier of the respective amplifier arrangements of the transmitter is independently operable in the Doherty mode in the desired frequency range of the transmitter and the broadband mode, wherein a first output of each respective coupler is terminated with a termination that is not in use and is physically non-switchable during operation, the respective terminations having one or more components including at least one of an inductance, a capacitor, or an element that is a series connection of an inductance and a capacitance ("LC element"), wherein an output signal of each amplifier is detectable at a second output of the respective couplers, and wherein, through a dimensioning of the one or more components of the respective terminations, a frequency range of the respective amplifiers in the Doherty mode is adjustable.

* * * * *